(12) United States Patent
Zhang et al.

(10) Patent No.: US 12,279,531 B2
(45) Date of Patent: Apr. 15, 2025

(54) ALGINATE HYDROGEL-BASED THIN-FILM HEAT FLUX SENSOR FOR BILLET CRYSTALLIZER

(71) Applicant: Xi'an Jiaotong University, Xi'an (CN)

(72) Inventors: Zhongkai Zhang, Xi'an (CN); Jiaming Lei, Xi'an (CN); Le Li, Xi'an (CN); Shuimin Li, Xi'an (CN); Bian Tian, Xi'an (CN); Libo Zhao, Xi'an (CN); Zhuangde Jiang, Xi'an (CN)

(73) Assignee: Xi'an Jiaotong University, Xi'an (CN)

( * ) Notice: Subject to any disclaimer, the term of this patent is extended or adjusted under 35 U.S.C. 154(b) by 70 days.

(21) Appl. No.: 18/487,880

(22) Filed: Oct. 16, 2023

(65) Prior Publication Data

US 2024/0099137 A1   Mar. 21, 2024

(30) Foreign Application Priority Data

Oct. 20, 2022 (CN) .......................... 202211288736.4

(51) Int. Cl.
*H10N 10/17* (2023.01)
*H10N 10/01* (2023.01)
*H10N 10/82* (2023.01)
*H10N 19/00* (2023.01)
*G01K 7/02* (2021.01)

(52) U.S. Cl.
CPC ............. *H10N 10/17* (2023.02); *H10N 10/01* (2023.02); *H10N 10/82* (2023.02); *H10N 19/00* (2023.02); *G01K 7/021* (2013.01)

(58) Field of Classification Search
CPC ........ H10N 10/17; H10N 19/00; H10N 10/01; H10N 10/82; H10N 30/30; H10N 30/302
See application file for complete search history.

(56) References Cited

U.S. PATENT DOCUMENTS 11,366,027 B2   6/2022   Atallah et al.

FOREIGN PATENT DOCUMENTS

| CN | 109798995 A |   | 5/2019 |   |
|----|-------------|---|--------|---|
| CN | 113984235 A | * | 1/2022 | ............... G01K 7/02 |

OTHER PUBLICATIONS

Liu et al., CN 113984235 A, English Machine Translation, pp. 1-14. (Year: 2022).*
Fu et al., "High-Temperature Heat Flux Sensor Based on Tungsten-Rhenium Thin-Film Thermocouple", IEEE Sensors Journal, vol. 20, No. 18, Sep. 15, 2020. (Year: 2020).*

* cited by examiner

*Primary Examiner* — Tae-Sik Kang

(57) ABSTRACT

An alginate hydrogel-based thin-film heat flux sensor for billet crystallizer includes an alginate hydrogel substrate. The alginate hydrogel substrate is configured in a U-shaped planar structure. The U-shaped planar structure includes a first side and a second side, and the first side is longer than the second side. An inner surface of the alginate hydrogel substrate is provided with a first film thermocouple and a second film thermocouple. The first film thermocouple is in crosslinking connection with the second film thermocouple.

10 Claims, 4 Drawing Sheets

ALGINATE HYDROGEL-BASED THIN-FILM HEAT FLUX SENSOR FOR BILLET CRYSTALLIZER

CROSS-REFERENCE TO RELATED APPLICATIONS

This application claims the benefit of priority from Chinese Patent Application No. 202211288736.4, filed on Oct. 20, 2022. The content of the aforementioned application, including any intervening amendments thereto, is incorporated herein by reference in its entirety.

TECHNICAL FIELD

This application relates to sensors, and more particularly to an alginate hydrogel-based thin-film heat flux sensor for billet crystallizer.

BACKGROUND

Heat flux sensors have been widely used in aerospace, ferrous metallurgy and petrochemical fields, especially in measurement of gas heat flux, thermal response to explosion products and thermal parameter measurement of molten steel crystallization process. Recently, a thin-film thermocouple temperature sensor structure based on MEMS (Micro-electro-mechanical Systems) technology has attracted considerable attention because of its small volume and fast response, and is expected to be used for heat flux detection.

In the heat flux measurement of a billet crystallizer, the molten steel is prone to adhering to the thin-film surface, and is even solidified to form steel, which will cause wear of a thin-film sensor, and even the failure of the sensor. This application solves the above problems. The similar Gardon gauge heat flux sensor is difficult to be directly used in the heat flux measurement of crystallizers in the absence of encapsulation. In the presence of the encapsulation shell, the response time will be greatly increased, resulting in slow response.

SUMMARY

In view of the shortcomings of the prior art, the present disclosure is to provide a heat flux sensor of alginate hydrogel film for billet crystallizer to solve the problems that the molten steel is prone to adhering to the thin-film surface, and is even solidified to form steel, which will cause wear of a thin-film sensor, and even the failure of the sensor, and the encapsulation shell will slow down the response rate which can not maintain fast response.

Technical schemes are as follows.

The present disclosure provides an alginate hydrogel-based thin-film heat flux sensor for billet crystallizer, comprising:

an alginate hydrogel substrate;
wherein the alginate hydrogel substrate is configured in a U-shaped planar structure; the U-shaped planar structure includes a first side and a second side, and the first side is longer than the second side; an inner surface of the alginate hydrogel substrate is provided with a first film thermocouple and a second film thermocouple; and the first film thermocouple is in crosslinking connection with the second film thermocouple.

In an embodiment, a distance between a hot junction of each of the first film thermocouple and the second thermocouple and a boundary of the alginate hydrogel substrate is 0.2 mm±0.1 mm.

In an embodiment, a linewidth of each of the first film thermocouple and the second film thermocouple is 20 $\mu m \pm 2$. The first film thermocouple is centrally arranged at the first side, and the second film thermocouple is centrally arranged at the second side.

In an embodiment, a thickness of the first film thermocouple and a thickness of the second film thermocouple are the same as a thickness of the alginate hydrogel substrate.

In an embodiment, the first film thermocouple includes a first positive electrode and a first negative electrode. The first positive electrode is connected with an end of the first negative electrode. The first positive electrode is arranged above the first negative electrode at a junction between the first positive electrode and the first negative electrode. The second film thermocouple includes a second positive electrode and a second negative electrode. The second positive electrode is connected with an end of the second negative electrode. And the second positive electrode is arranged above the second negative electrode at a junction between the second positive electrode and the second negative electrode.

In an embodiment, the first positive electrode and the second positive electrode are both prepared by soaking the alginate hydrogel substrate in a sodium alginate solution.

In an embodiment, the first negative electrode and the second negative electrode are both prepared by soaking the alginate hydrogel substrate in a polyethylene silicate solution.

In an embodiment, the first film thermocouple is connected to outside through a first metal lead wire group, and the second film thermocouple is connected to the outside through a second metal lead wire group.

In an embodiment, the first metal lead wire group includes a first lead wire and a second lead wire. The second metal lead wire group includes a third lead wire and a fourth lead wire. A first end of the first lead wire is connected with the first positive electrode, and a first end of the second lead wire is connected with the first negative electrode. A first end of the third lead wire is connected with the second positive electrode, and a first end of the fourth lead wire is connected with the second negative electrode. A second end of the first lead wire, a second end of the second lead wire, a second end of the third lead wire and a second end of the fourth lead wire are connected with a voltmeter, respectively.

In an embodiment, a length of the second side is 6 mm±0.1 mm, and a length of the first side is 7 mm±0.1 mm. A width of the second side and a width of the first side are both 1 mm±0.1 mm. A width of the alginate hydrogel substrate is 4 mm±0.1 mm. And the thickness of the alginate hydrogel substrate is 3 mm±0.1 mm.

Compared to the prior art, the present disclosure has the following beneficial effects.

The alginate hydrogel-based thin-film heat flux sensor for billet crystallizer utilizes a super wear-resistant characteristic of alginate hydrogel, so as to ensure that a film sensor will not be worn to cause failure with even solidified to form steel formed by molten steel in a heat flux measurement of billet crystallizer, and the fast response can be maintained without the encapsulation shell. The alginate hydrogel substrate is provided as the U-shaped planar structure. The first side and the second side are configured to ensure stable temperature measurement of the first film thermocouple and the second film thermocouple at two hot junctions, and play a guarantee role in heat flux by calculating a relationship of temperature differences and positions, and a relationship of thermal transmission.

In an embodiment, the distance between the hot junction of each of the first film thermocouple and the second film thermocouple and the boundary of the alginate hydrogel substrate 0.2 mm±0.1 mm, which can make temperature values measured by the two hot junctions different. The portion of the long side exceeding the short side is configured as a heat resistance layer. And under the determination of position differences, according to the thermal model, a heat flux density can be calculated based on shapes and parameters of materials, temperature differences and a size of the heat resistance layer.

In an embodiment, the linewidth of each of the first film thermocouple and the second film thermocouple is 20 μm±2 μm, and the first film thermocouple is centrally arranged at the first side, and the second film thermocouple is centrally arranged at the second side. On one hand, the linewidth is small, which can decrease measurement errors caused by temperature uniformity. On the other hand, an arrangement of the linewidth can ensure a same thermal transmission mode and is easy to calculate the heat flux.

In an embodiment, the thickness of the first film thermocouple and the thickness of the second film thermocouple are provided as the same as the thickness of the alginate hydrogel substrate, which can ensure a thermal transmission between the first film thermocouple, the second film thermocouple and the alginate hydrogel is uniform, and effectively reduce a thermal transmission error in a thickness direction of a wall surface of the alginate hydrogel substrate.

In an embodiment, the first positive electrode is connected with an end of the first negative electrode, and the second positive electrode is connected with an end of the second negative electrode. The first positive electrode is arranged above the first negative electrode at the junction between the first positive electrode and the first negative electrode, and the second positive electrode is arranged above the second negative electrode at the junction between the second positive electrode and the second negative electrode, which can ensure a uniform contact to form two junctions, so as to output stable thermo-electromotive force.

In an embodiment, the first positive electrode and the second positive electrode are both prepared by soaking the alginate hydrogel substrate in the sodium alginate solution, which is provided in the U-shaped planar structure, so as to further ensure the wear-resistant characteristic of the alginate hydrogel.

In an embodiment, the first negative electrode and the second negative electrode are both prepared by soaking the alginate hydrogel substrate in the polyethylene silicate solution, which is provided in the U-shaped planar structure, so as to further ensure the wear-resistant characteristic of the alginate hydrogel.

In an embodiment, the first film thermocouple and the second film thermocouple is connected to the outside through the first metal lead wire group, and the second film thermocouple is connected to the outside through the second metal lead wire group, which is easy to lead out a passive voltage signal. In addition, the first metal lead wire group and the second metal lead wire group can reduce internal resistances so as to match impedances of external instruments.

In an embodiment, the second end of the first lead wire, the second end of the second lead wire, the second end of the third lead wire and the second end of the fourth lead wire are connected with the voltmeter, respectively, which is easy to lead out the passive voltage signal and can distinguish a first signal output from the first film thermocouple and a second signal output form the second thermocouple.

In an embodiment, the length of the second side is 6 mm±0.1 mm, and the length of the first side is 7 mm±0.1 mm. The width of the second side and the width of the first side are both 1 mm±0.1 mm. The whole width of the alginate hydrogel substrate is 4 mm±0.1 mm. The thickness of the alginate hydrogel substrate is 3 mm±0.1 mm. In this case, the heat flux sensor has simple preparation, small volume and convenient operation, and can reduce the error caused by thermal transmission.

The alginate hydrogel-based heat flux sensor prepared herein is superhard and super wear-resistant. Besides, the heat flux sensor has characteristics of miniaturization and convenient installation, which can be used in heat flux measurement in a high-wear environment. The present disclosure has advantages of reasonable and simple structure and easy assembly, and can fully utilize the directional flow in microstructured gas film pores.

The present disclosure will be clearly and completely described below with reference to the embodiments and accompanying drawings.

Figure 1:
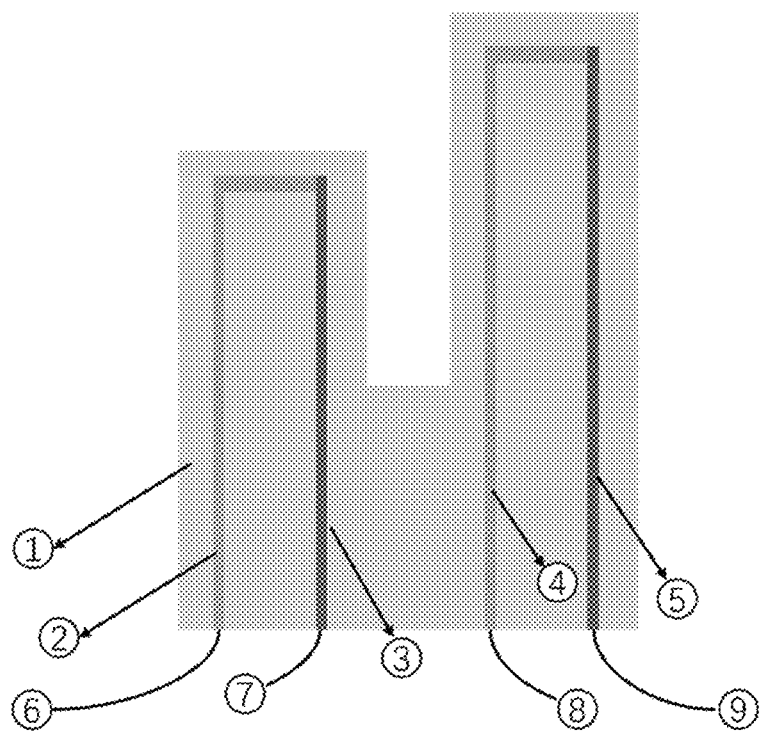
FIG. 1 is a front view of an alginate hydrogel-based thin-film heat flux sensor according to an embodiment of the present disclosure.

In the figures: 1, alginate hydrogel substrate; 2, first positive electrode; 3, first negative electrode; 4, second positive electrode; 5, second negative electrode; 6, first lead wire; 7, second lead wire; 8, third lead wire; and 9, fourth lead wire.

DETAILED DESCRIPTION OF EMBODIMENTS

The present disclosure will be further described below with reference to the accompanying drawings and embodiments. It can be understood that the embodiments described herein are only to illustrate this application rather than limiting this application. It should be noted that any embodiment made by those skilled in the art without departing from the spirit of this application shall fall within the scope of this application defined by the appended claims.

In the description of this embodiment, the orientation or position relationship indicated by the terms "center", "vertical", "transverse", "up", "down", "front", "back", "left", "right", "horizontal", "top", "bottom", "inside", "outside", "a side" and "an end" is based on the orientation or position relationship shown in the accompanying drawings. These terms are only for facilitating description and simplifying operation rather than indicting or implying that the devices or components must have a particular orientation or construction and operation in a particular orientation or construction. Therefore, these terms should not be regarded as the limitation of this application. Besides, the terms "first" and "second" are only used for distinguishment without other special meanings. As used herein, "multiple" means two or more unless otherwise clearly stated.

As used herein, unless otherwise expressly specified and limited, the terms "connection", "linkage" and "fixing" should be interpreted in a broad sense. For example, it can be "fixedly connection", "removable connection" or "integral connection"; it can be "mechanical connection" or "electrical connection"; it can be "direct connection" or "indirect connection through an intermediate medium"; it can be internal communication or interaction between two components. For those of ordinary skill in the art, the specific meaning of these terms can be understood in specific cases.

It should be understood that, as used in the specification and the accompanying claims, the terms "include" and "comprise" indicate the presence of features, wholes, steps, operations, elements and/or components, and do not exclude the presence or addition of one or more other features, wholes, steps, operations, elements, components and/or collections thereof.

It should be understood that the description is only used to explain the principle of the disclosure, and cannot be interpreted as the limitation to the protection scope of the disclosure in any way. As used herein, unless otherwise expressly indicated, the terms "a", "an" and "the" can imply plurality.

It should be understood that the term "and/or" used herein includes any and all combinations of one or more relevant listed items.

The accompanying figures schematically show various structures according to the embodiments of the present disclosure. The figures are not drawn to scale, in which some details are enlarged and may be omitted for the purpose of clarity. The shapes of various regions and layers and the relative sizes and positions thereof shown in the figures are only illustrative, and may be deviated in practice because of manufacturing tolerances or technical restrictions. And regions/layers with different shapes, sizes and relative positions can be designed by those of ordinary skill in the art according to practical needs.

The present disclosure provides an alginate hydrogel-based thin-film heat flux sensor for billet crystallizer, in which the super wear-resistant alginate hydrogel is introduced to ensure that a film sensor will not be worn by the solidified steel to suffer a failure in the heat flux measurement of billet crystallizers, and the absence of an encapsulation shell can achieve a fast response. The positive electrode of the heat flux sensor is prepared by soaking the alginate hydrogel substrate in a sodium alginate solution for crosslinking, and the negative electrode of the heat flux sensor is prepared by crosslinking of the alginate hydrogel substrate with polyethylene silicate. The positive and negative electrodes are both prepared in the alginate hydrogel substrate to further improve the wear-resistant characteristic. The U-shaped planar alginate hydrogel substrate has a long side and a short side, so as to ensure that the temperature difference measured by the thin-film thermocouple between two hot junctions is stable, thereby rendering the heat flux calculated based on the relationship between temperature difference and position or thermal transmission reliable.

Figure 2:
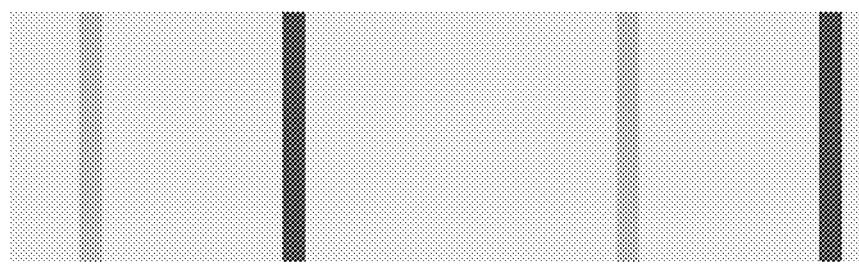
FIG. 2 is a sectional view of the alginate hydrogel-based thin-film heat flux sensor according to an embodiment of the present disclosure.
Figure 3:
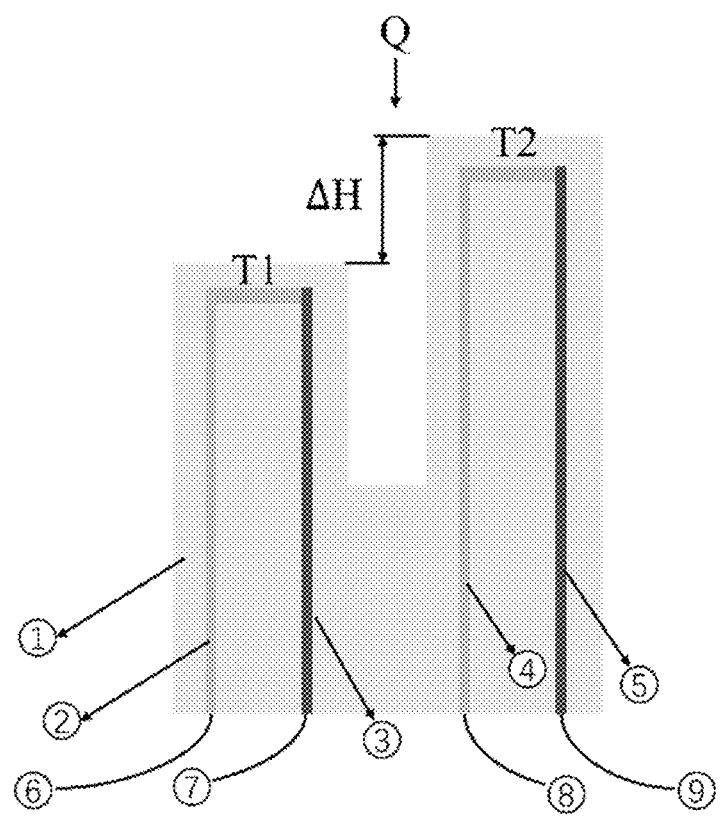
FIG. 3 schematically shows a working principle of the alginate hydrogel-based thin-film heat flux sensor according to an embodiment of the present disclosure.

Referring to FIGS. 1-3, the present disclosure provides an alginate hydrogel-based thin-film heat flux sensor for billet crystallizer including an alginate hydrogel substrate 1, a first film thermocouple and a second film thermocouple. An inner surface of the alginate hydrogel substrate 1 is formed by crosslinking of the first film thermocouple and the second film thermocouple. A lower end of the first film thermocouple is connected with a first metal lead wire group, and a lower end of the second film thermocouple is connected with a second metal lead wire group. The alginate hydrogel substrate 1 is provided as the U-shaped planar structure. And the U-shaped planar structure includes the first side and the second side, and the first side is longer than the second side.

In an embodiment, a width of the alginate hydrogel substrate 1 is 4 mm±0.1 mm, and a thickness of the alginate hydrogel substrate 1 is 3 mm±0.1 mm. A length of the second side is 6 mm±0.1 mm, and a length of the first side is 7 mm±0.1 mm. And a width of the second side and a width of the first side are both 1 mm±0.1 mm.

The first film thermocouple includes a first positive electrode 2 and a first negative electrode 3. And the second film thermocouple includes a second positive electrode 4 and a second negative electrode 5.

The first positive electrode 2 is connected with an end of the first negative electrode 3. And the first positive electrode 2 is arranged above the first negative electrode 3 at a junction between the first positive electrode and the first negative electrode. The second positive electrode 4 is connected with an end of the second negative electrode 5. And the second positive electrode 4 is arranged above the second negative electrode 5 at a junction between the second positive electrode and the second negative electrode.

The first positive electrode 2 and the second positive electrode 4 are both prepared by soaking the alginate hydrogel substrate in the sodium alginate solution.

The first negative electrode 3 and the second negative electrode 5 are both prepared by soaking the alginate hydrogel substrate in the polyethylene silicate solution.

A distance between a hot junction of each of the first film thermocouple and the second film thermocouple and a boundary of the alginate hydrogel substrate is 0.2 mm±0.1 mm.

A linewidth of each of the first film thermocouple and the second film thermocouple is 20 μm±2 μm. The first film thermocouple is centrally arranged at the first side, and the second film thermocouple is centrally arranged at the second side. And a thickness of the first film thermocouple and a thickness of the second film thermocouple are the same as the thickness of the alginate hydrogel substrate 1.

The first metal lead wire group includes a first lead wire 6 and a second lead wire 7. The second metal lead wire group includes a third lead wire 8 and a fourth lead wire 9. A first end of the first lead wire 6 is connected with the first positive electrode 2, and a first end of the second lead wire 7 is connected with the first negative electrode 3. A first end of the third lead wire 8 is connected with the second positive electrode 4, and a first end of the fourth lead wire 9 is connected with the second negative electrode 5.

A second end of the first lead wire 6, a second end of the second lead wire 7, a second end of the third lead wire 8 and a second end of the fourth lead wire 9 are connected with a voltmeter, respectively. And the heat flux is calculated by the relationship of the temperature differences and the positions and the relationship of the thermal transmission.

The working principle of the heat flux sensor of the present disclosure will be illustrated as follows with reference to FIG. 3.

A heat flux density can be calculated according to Fourier's law of heat conduction based on the temperature difference generated between two sides of a heat resistance layer, represented by:

$$Q = \frac{dQ}{ds} = -\lambda \frac{\partial T}{\partial X}; \quad (1)$$

where Q represents the heat flux density, W/m²; dQ represents the heat flux through an isothermal surface ds, W; ∂T/∂X represents a temperature gradient of the heat flux along a direction perpendicular to the isothermal surface; and λ is a thermal conductivity of a material, W/m²·K.

For two parallel isothermal surfaces respectively with a temperature of T and T+ΔT, the heat flux density is calculated as follows:

$$Q = -\lambda \frac{\Delta T}{\Delta X}; \quad (2)$$

where ΔT represents the temperature difference between the two isothermal surfaces, ° C. ΔX represents a distance between the two isothermal surfaces, m.

According to the above formulas, if the material and geometrical dimension of a heat flux sensor are determined, the heat flux value can be calculated by measuring a thermal electromotive force generated by a thermopile under the action of the temperature difference between two sides of the heat resistance layer. According to the temperature measuring principle of the thermopile, the thermal electromotive force E is represented by:

$$E = S\Delta T \quad (3);$$

where S represents a Seebeck coefficient of the thin-film thermocouple, mV/° C.; and a relationship between the heat flux density and an output of the thermopile is represented by:

$$Q = \frac{\lambda}{dS}, \quad (4)$$

converted into $$\frac{E}{Q} = \frac{dS}{\lambda}; \quad (5)$$

where d represents a thickness of the heat resistance layer, m.

Figure 4:
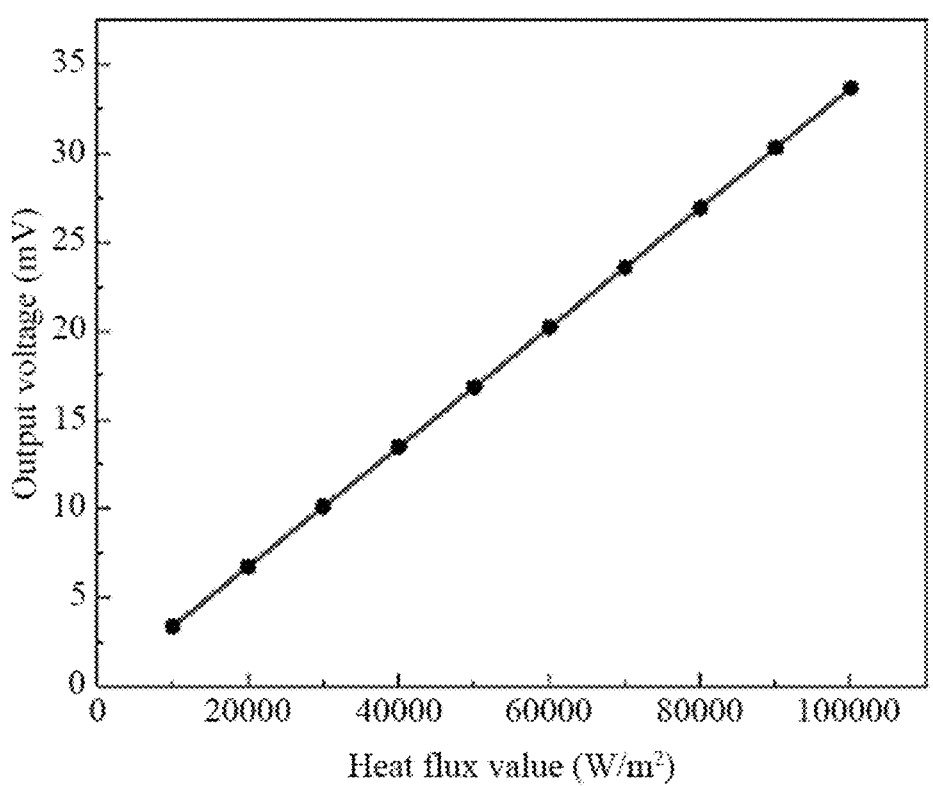
FIG. 4 schematically shows a simulation heat flux output relationship of the alginate hydrogel-based thin-film heat flux sensor according to an embodiment of the present disclosure.

FIG. 4 depicts a simulation curve showing relationship between the output voltage and the heat flux value, and output changes of the thin-film thermocouple can be obtained based on simulation calculation by changing the thickness and thermal conductivity of the heat resistance layer, so as to verify advantages of the present disclosure.

In summary, the present disclosure solves the problems that the traditional thin-film sensor will be worn by the solidified steel to suffer a failure in the heat flux measurement of billet crystallizers in the absence of an encapsulation structure, and avoids the increase in response time caused by the encapsulation, so as to facilitate the heat flux measurement of billet crystallizers.

Described above are only detailed description of embodiments of this application, and are not intended to limit this application in any form. A series of optimizations, improvements and modifications can be made by those skilled in the art based on this application. It should be noted that those optimizations, improvements and modifications made without departing from the spirit of this application shall fall within the scope of this application defined by the appended claims.

What is claimed is:

1. An alginate hydrogel-based thin-film heat flux sensor for billet crystallizer, comprising:
an alginate hydrogel substrate;
wherein the alginate hydrogel substrate is configured in a U-shaped planar structure; the U-shaped planar structure comprises a first side and a second side, and the first side is longer than the second side; an inner surface of the alginate hydrogel substrate is provided with a first film thermocouple and a second film thermocouple; and the first film thermocouple is in crosslinking connection with the second film thermocouple.

2. The alginate hydrogel-based thin-film heat flux sensor of claim 1, wherein a distance between a hot junction of each of the first film thermocouple and the second film thermocouple and a boundary of the alginate hydrogel substrate is 0.2 mm±0.1 mm.

3. The alginate hydrogel-based thin-film heat flux sensor of claim 1, wherein a linewidth of each of the first film thermocouple and the second film thermocouple is 20 μm±2 μm; and the first film thermocouple is centrally arranged at the first side, and the second film thermocouple is centrally arranged at the second side.

4. The alginate hydrogel-based thin-film heat flux sensor of claim 1, wherein a thickness of the first film thermocouple and a thickness of the second film thermocouple are the same as a thickness of the alginate hydrogel substrate.

5. The alginate hydrogel-based thin-film heat flux sensor of claim 1, wherein the first film thermocouple comprises a first positive electrode and a first negative electrode; the first positive electrode is connected with an end of the first negative electrode; the first positive electrode is arranged above the first negative electrode at a junction between the first positive electrode and the first negative electrode; the second film thermocouple comprises a second positive electrode and a second negative electrode; the second positive electrode is connected with an end of the second negative electrode; and the second positive electrode is arranged above the second negative electrode at a junction between the second positive electrode and the second negative electrode.

6. The alginate hydrogel-based thin-film heat flux sensor of claim 5, wherein the first positive electrode and the second positive electrode are both prepared by soaking the alginate hydrogel substrate in a sodium alginate solution.

7. The alginate hydrogel-based thin-film heat flux sensor of claim 5, wherein the first negative electrode and the second negative electrode are both prepared by soaking the alginate hydrogel substrate in a polyethylene silicate solution.

8. The alginate hydrogel-based thin-film heat flux sensor of claim 1, wherein the first film thermocouple is connected to outside through a first metal lead wire group, and the second film thermocouple is connected to the outside through a second metal lead wire group.

9. The alginate hydrogel-based thin-film heat flux sensor of claim 8, wherein the first metal lead wire group comprises a first lead wire and a second lead wire; the second metal lead wire group comprises a third lead wire and a fourth lead wire; a first end of the first lead wire is connected with the first positive electrode, and a first end of the second lead wire is connected with the first negative electrode; a first end of the third lead wire is connected with the second positive electrode, and a first end of the fourth lead wire is connected with the second negative electrode; and a second end of the first lead wire, a second end of the second lead wire, a second end of the third lead wire and a second end of the fourth lead wire are connected with a voltmeter, respectively.

10. The alginate hydrogel-based thin-film heat flux sensor of claim 1, wherein a length of the second side is 6 mm±0.1 mm, and a length of the first side is 7 mm±0.1 mm; a width of the second side and a width of the first side are both 1 mm±0.1 mm; a width of the alginate hydrogel substrate is 4 mm±0.1 mm; and a thickness of the alginate hydrogel substrate is 3 mm±0.1 mm.

* * * * *